United States Patent
Riedel

(10) Patent No.: US 7,288,812 B2
(45) Date of Patent: Oct. 30, 2007

(54) SEMICONDUCTOR MEMORY WITH VIRTUAL GROUND ARCHITECTURE

(75) Inventor: Stephan Riedel, Dresden (DE)

(73) Assignee: Infineon Technologies AG, Munich (DE)

(*) Notice: Subject to any disclaimer, the term of this patent is extended or adjusted under 35 U.S.C. 154(b) by 64 days.

(21) Appl. No.: 10/857,637

(22) Filed: May 27, 2004

(65) Prior Publication Data

US 2005/0006710 A1 Jan. 13, 2005

(30) Foreign Application Priority Data

May 30, 2003 (DE) .............................. 103 24 612

(51) Int. Cl.
*H01L 29/788* (2006.01)
(52) U.S. Cl. ...................... 257/316; 257/315; 257/317; 257/321
(58) Field of Classification Search ................ 257/202, 257/390, 315–317, 321; 365/72, 185
See application file for complete search history.

(56) References Cited

U.S. PATENT DOCUMENTS

| | | | | |
|---|---|---|---|---|
| 5,671,177 A * | 9/1997 | Ueki | ...................... | 365/185.11 |
| 5,760,437 A * | 6/1998 | Shimoji | ....................... | 257/316 |
| 5,976,930 A | 11/1999 | Noble | | |
| 6,034,894 A | 3/2000 | Maruyama et al. | | |
| 6,936,891 B2 * | 8/2005 | Saito et al. | ................. | 257/331 |
| 2002/0149081 A1 * | 10/2002 | Goda et al. | ................. | 257/510 |
| 2003/0007386 A1 * | 1/2003 | Georgakos et al. | .... | 365/185.17 |

FOREIGN PATENT DOCUMENTS

| | | |
|---|---|---|
| JP | 09-082921 | 3/1997 |
| JP | 09-107087 | 4/1997 |
| JP | 2003-046002 | 2/2003 |

\* cited by examiner

*Primary Examiner*—Mary Wilczewski
*Assistant Examiner*—Tsz K. Chiu
(74) *Attorney, Agent, or Firm*—Slater & Matsil, L.L.P.

(57) ABSTRACT

Insulation regions in the manner of STI isolations, which run transversely with respect to the word lines, isolate the source/drain regions of adjacent memory cells. Metallic bit lines are applied on the top side and patterned for example along zigzag lines such that the source/drain regions of a memory transistor which are contact-connected by the bit lines are in each case electrically connected by two mutually adjacent bit lines.

25 Claims, 8 Drawing Sheets

SEMICONDUCTOR MEMORY WITH VIRTUAL GROUND ARCHITECTURE

TECHNICAL FIELD

The present invention relates generally to a semiconductor memory device and more particularly to a semiconductor memory with virtual ground architecture.

BACKGROUND

A semiconductor memory comprises a row-wise and column-wise arrangement of memory cells each having a transistor structure. In the case of charge trapping memory cells, the gate dielectric is formed as a storage layer sequence made from three successive insulation layers, the central one of which is suitable for trapping charge carriers from the channel region, for example hot electrons in the channel (CHE, channel hot electrons) or electrons which pass from the channel into the storage layer by Fowler-Nordheim tunneling. This storage layer sequence may be for example a three-layered sequence of an oxide layer, a nitride layer and a further oxide layer, of which the oxide layers represent the boundary layers of the actual storage layer made of nitride. A charge trapping memory cell is erased, depending on the conception, for example by injection of hot holes or Fowler-Nordheim tunneling.

In the case of a common source architecture, source lines which interconnect the source regions column-wise are present in the semiconductor body. Running parallel thereto are the word lines, which connect the gate electrodes to one another column-wise and are used for the selection of a relevant memory cell. The bit lines run transversely with respect to the word lines and the source lines on the top side and are contact-connected to the drain regions of a respective row. Since, in this case, only the source lines and the source/drain regions are formed as doped regions in the semiconductor material, it is possible for the individual memory cells to be electrically insulated from one another by insulation regions arranged in between. Therefore, an electrical insulation of the cells among one another should also be possible if only the source/drain regions are arranged in the semiconductor material, but no lines are present there. This is the case with a virtual ground architecture, in which the source regions and the drain regions are in each case contact-connected on the top side via bit lines and are selected for the programming and read-out of, in each case, two of said bit lines which are adjacent to one another. However, the problem of a suitable arrangement of said bit lines for the top-side contact-connection of the source/drain regions arises in this case.

SUMMARY OF THE INVENTION

In one aspect, the present invention provides a semiconductor memory with a virtual ground architecture in which the memory cells are electrically insulated from one another and the word lines and bit lines required for addressing the memory cells are provided on the top side.

In the case of the invention's semiconductor memory with virtual ground architecture, in a manner known per se, a plurality of memory cells having a respective memory transistor are present, which are arranged row-wise and column-wise. The memory transistor has a channel region between source/drain regions, which are formed in the semiconductor material by introduction of dopant, and also a gate electrode, which is isolated from the channel region by a storage layer sequence, in particular an ONO layer sequence, provided for charge trapping and is part of a word line. Arranged parallel at a distance from one another are word lines and bit lines running transversely with respect thereto, which are provided for addressing the memory cells.

Problems with prior art architectures are solved by virtue of the fact that insulation regions that are preferably formed by cutouts or trenches filled with dielectric material in the manner of an STI (shallow trench isolation) are present between the word lines. In accordance with a consecutive numbering of the source/drain regions along a respective word line, in the case of which the source/drain regions which are present on different sides of the word line and lie directly opposite one another with respect to the word line in each case acquire the same number, on one side of the word line, at least in each case one even-numbered source/drain region is electrically insulated from the subsequent odd-numbered source/drain region in the numbering by an insulation region, and on the opposite side of the word line, at least in each case one odd-numbered source/drain region is electrically insulated from the subsequent even-numbered source/drain region in the numbering by an insulation region. The regions occupied by the memory cells are determined by the width of the word lines and the distance between successive insulation regions.

In one embodiment of the semiconductor memory, the insulation regions may be formed by strip-type isolation trenches running transversely with respect to the word lines, in which case the bit lines applied on the top side are then configured in a specific manner and contact-connected on the source/drain regions. The bit lines are arranged such that they run obliquely or diagonally with respect to the word lines at least in sections, so that the source/drain regions of the relevant memory transistor which are associated with a respective memory cell are connected to two mutually adjacent bit lines. For this purpose, the bit lines may be arranged in a zigzag line or run as diagonal interconnects obliquely and parallel to one another over the matrix-type arrangement of memory cells. However, arbitrary arrangements with bit lines arranged obliquely with respect to the word lines, e.g., an angle of 45°, at least in sections are possible, in principle.

A further preferred exemplary embodiment provides for the source/drain regions to be connected in pairs via connection regions which are arranged transversely with respect to the bit lines and simultaneously form so called "landing pads" for the contact-connection of the bit lines. In this exemplary embodiment, the bit lines may be arranged parallel at a distance from one another transversely with respect to the word lines in a conventional manner.

BRIEF DESCRIPTION OF THE DRAWINGS

Examples of the semiconductor memory are described in more detail below with reference to FIGS. 1 to 11.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
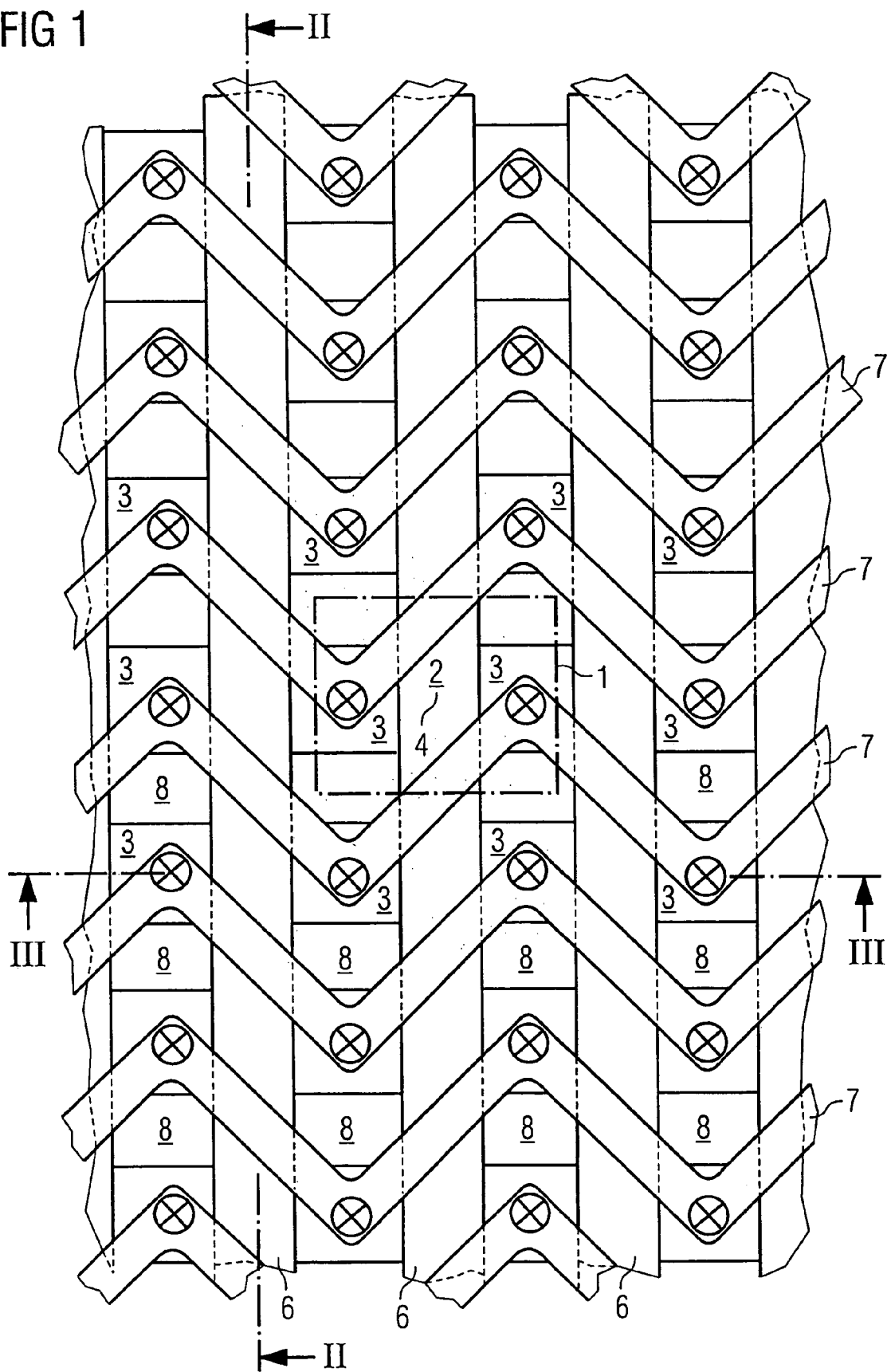
FIG. 1 shows a plan view of a scheme of the arrangement of the word lines and bit lines in the memory cell array.

FIG. 1 illustrates a schematic plan view of an arrangement of the memory cells. A memory cell 1 is formed by a memory transistor that is emphasized by a border of broken lines. The associated memory transistor has a channel region 2, which is present in the semiconductor material below the word line 6, and source/drain regions 3. The gate electrode 4 above the channel region 2 is part of a word line 6. The gate electrode is isolated from the semiconductor material of the channel region by a thin gate dielectric, which, in the semiconductor memory described here, is formed by a storage layer sequence that is not illustrated in FIG. 1.

The bit lines 7 run on the top side transversely with respect to the word lines 6 and are electrically insulated from the word lines. The bit lines 7 are, in particular, metal interconnects or metallic interconnects, which may be, for example, tungsten or a tungsten silicide. The bit lines 7 are electrically conductively connected to a row of source/drain regions 3. For this purpose, a dielectric present between the word lines and on the word lines for electrical insulation is open between each bit line and a relevant source/drain region 3, and the material of the bit lines is electrically conductively connected to the semiconductor material of the relevant source/drain region at these locations. The source/drain contacts of the bit lines 7 are identified by the encircled crosses in FIG. 1. In the exemplary embodiment of FIG. 1, the bit lines run along zigzag lines, so that the source/drain regions 3 of a respective memory cell 1 are connected to two mutually adjacent bit lines 7. A memory cell 1 can, therefore, be addressed by selection of a word line 6 and two mutually adjacent bit lines 7.

In the case of charge trapping memory cells 1, the storage layer sequence 5 is made from three successive insulation layers, the central one of which is suitable for trapping charge carriers from the channel region, for example hot electrons in the channel (CHE, channel hot electrons) or electrons which pass from the channel into the storage layer by Fowler-Nordheim tunneling. This storage layer sequence 5 may be, for example, a three-layered sequence of an oxide layer, a nitride layer and a further oxide layer, of which the oxide layers represent the boundary layers of the actual storage layer made of nitride. A charge trapping memory cell is erased, depending on the conception, for example by injection of hot holes or Fowler-Nordheim tunneling.

Figure 2:
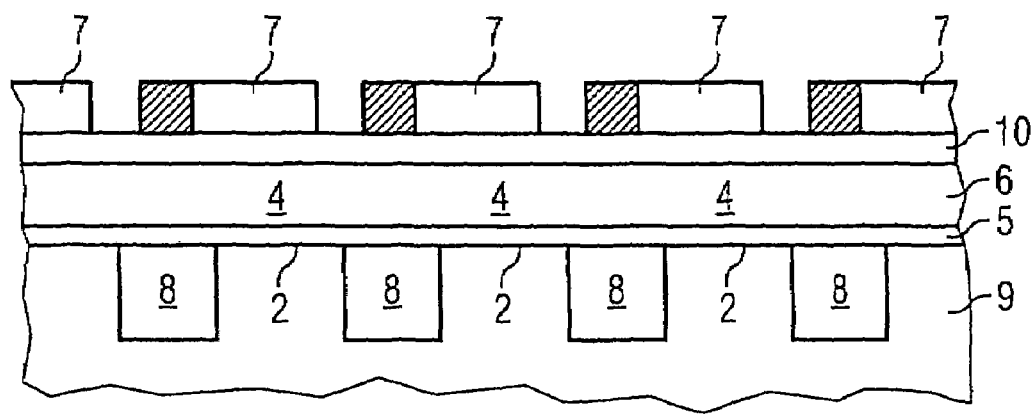
FIG. 2 shows the cross-section along a word line marked in FIG. 1.

FIG. 2 shows the cross-section marked in FIG. 1 in which it is possible to discern the vertical structure of the semiconductor memory along a word line 6. The storage layer sequence 5 is present above a respective channel region 2 in the substrate 9 or semiconductor body. The storage layer sequence 5 electrically insulates the respective gate electrode 4 from the semiconductor material and is provided for trapping charge carriers during the programming operation. In this case, the gate electrodes 4 are part of a word line 6, which is electrically insulated from the bit lines 7 by an insulation layer 10. The sectional area of the bit lines 7, which is present in the cross-section of FIG. 2 is depicted in hatched fashion. The area of the bit lines 7, which in each case adjoins the hatched area toward the right, represents the front sidewall—in the viewing direction—of the bit line extending obliquely behind the plane of the drawing. In the substrate 9, there are insulation regions 8 present between the individual memory cells, which insulation regions are also depicted in FIG. 1 and, in this exemplary embodiment, are formed transversely with respect to the word lines 6 in the manner of a trench filled with dielectric material in accordance with an STI.

Figure 3:
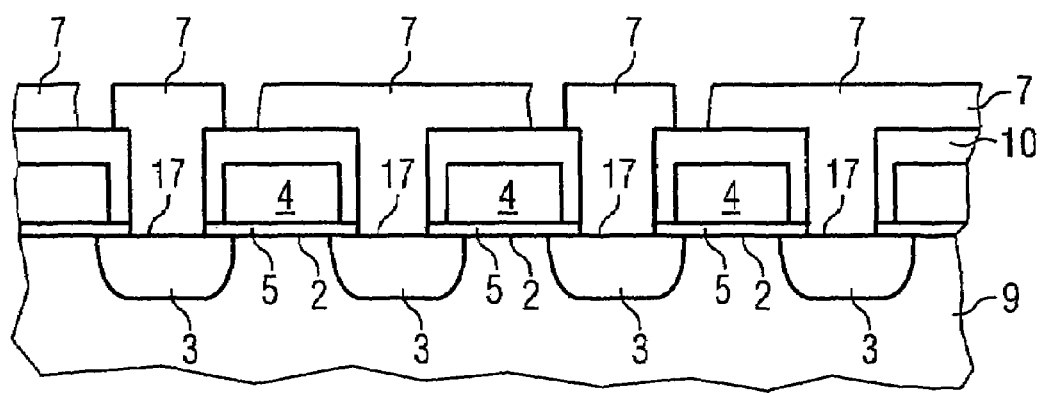
FIG. 3 shows the cross-section transversely with respect to the word lines marked in FIG. 1.

FIG. 3 shows the cross-section transversely with respect to the word lines 6 marked in FIG. 1. FIG. 3 depicts the channel regions 2 between the source/drain regions 3 in the substrate 9. The gate electrodes 4, which are in each case isolated from the channel region 2 by a portion of the storage layer sequence 5, are in each case part of the word lines 6 running perpendicular to the plane of the drawing. The bit lines 7 are electrically insulated from the word lines by the insulation layer 10. The insulation layer 10 also covers the sidewalls of the word lines 6. Situated in between is an electrically conductive connection between the bit lines 7 and a source/drain contact 17 on the source/drain regions 3. The source/drain contacts 17 occupy approximately the regions illustrated by the encircled crosses in FIG. 1.

Figure 4:
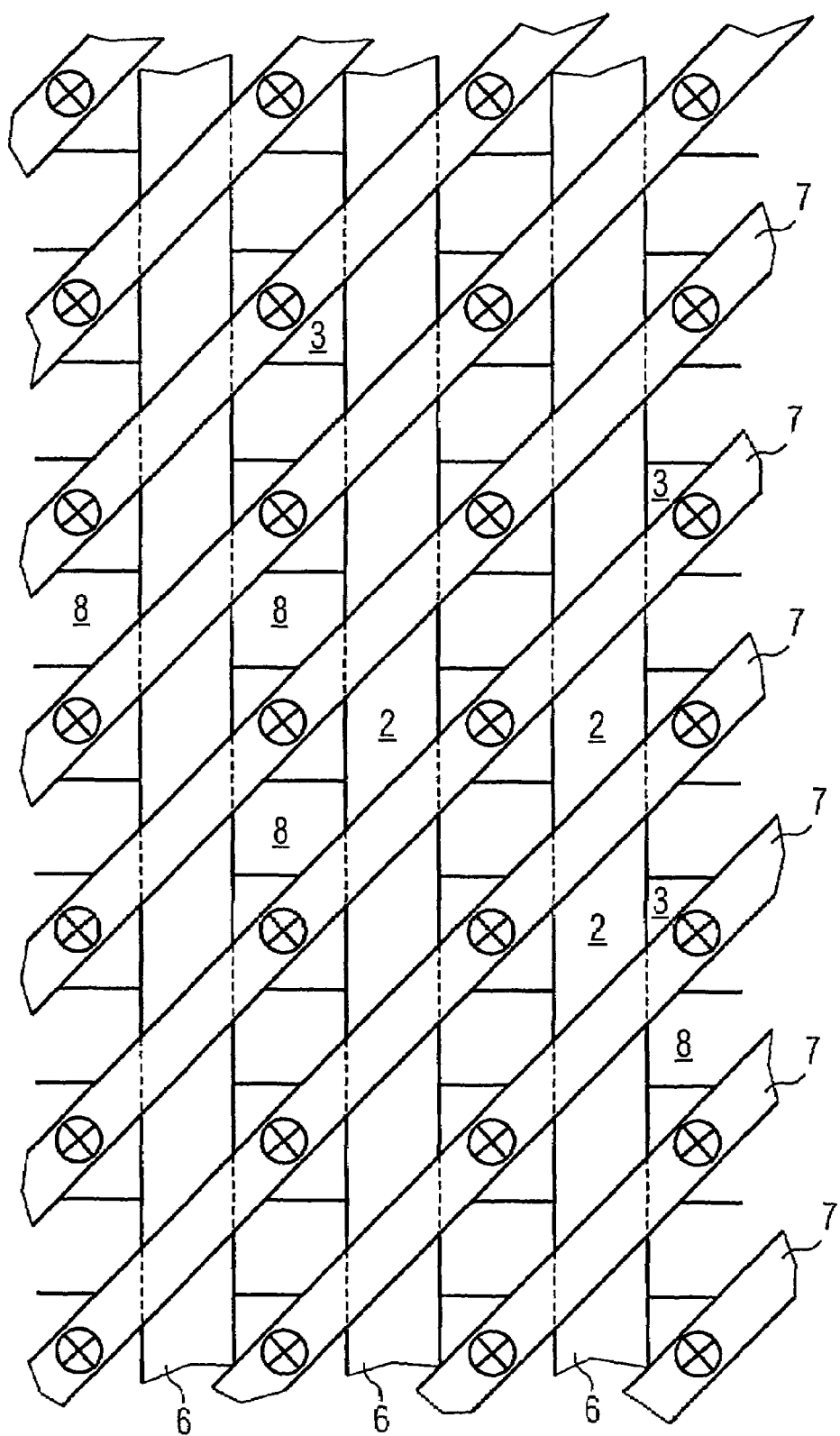
FIG. 4 shows the plan view in accordance with FIG. 1 for an alternative exemplary embodiment.

FIG. 4 shows a schematic plan view of the memory cell array in accordance with FIG. 1 for an exemplary embodiment in which the bit lines 7 are arranged such that they run rectilinearly parallel at a distance from one another and approximately at an angle of 45° with respect to the word lines 6. In the case of this arrangement of the bit lines, too, the individual memory transistors are selected by selection of two mutually adjacent bit lines. Selection of these bit lines and of one of the word lines results in an unambiguous addressing of the relevant memory cell. It emerges from the exemplary embodiments in accordance with FIG. 1 and FIG. 4 that the bit lines 7 can be arranged in different ways if it is only ensured that the requisite voltage can be applied between source and drain of the respective memory transistor to be programmed or to be read.

Figure 5:
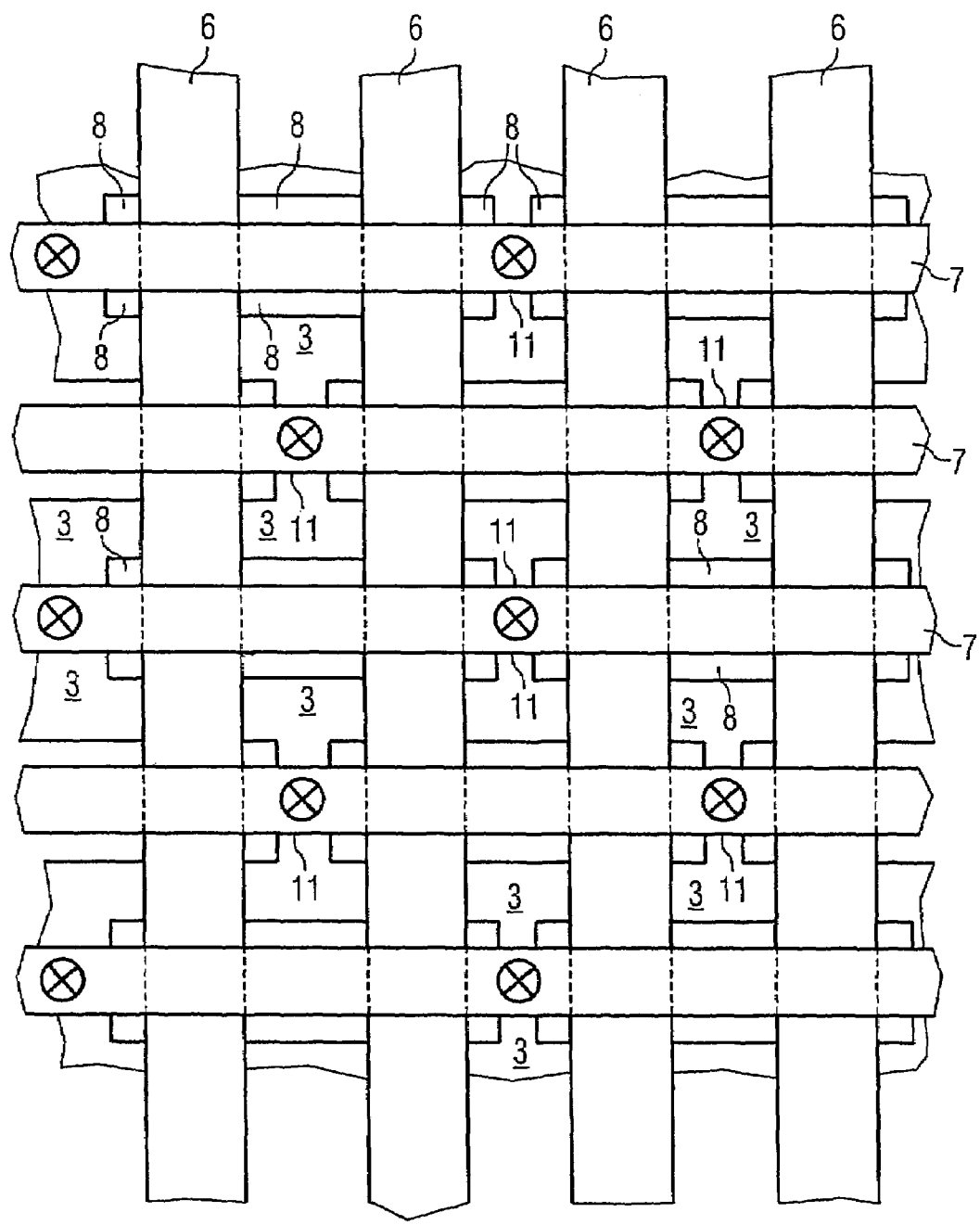
FIG. 5 shows the plan view in accordance with FIG. 1 for a further embodiment variant.

In the exemplary embodiment, which is illustrated in a plan view in FIG. 5, the individual parts are provided with the same reference symbols as in FIGS. 1 and 4. In this exemplary embodiment, the word lines 6 and the bit lines 7 cross at right angles and are in each case arranged parallel at a distance from one another. The bit lines 7 run in a longitudinal direction of the insulation regions 8. In contrast to the exemplary embodiments in accordance with FIGS. 1 and 4, the insulation regions 8 are not formed by a continuous, strip-type trench filling, but rather are in each case interrupted by a connection region 11 associated with the active area of the memory cell array. The connection region 11 is doped semiconductor material on which a respective source/drain contact 17 is applied, to which a respective bit line 7 is connected. The connection region 11 thus forms an electrically conductive connection to two source/drain regions 3 arranged next to one another. In the case of this arrangement of the bit lines, it is therefore possible, by means of the connection regions 11, to program or read a memory transistor selected by a word line via two mutually adjacent bit lines 7. The connection regions 11 form a type of "landing pads" for the contact-connection of the bit lines on the active area.

The insulation regions 8 present below two mutually adjacent bit lines 7 are offset relative to one another by half a length in the longitudinal direction of the bit lines. In this way, it is possible for mutually adjacent memory cells to be electrically insulated from one another in this exemplary embodiment as well. This exemplary embodiment has the advantage that the bit lines can be produced in a simple manner owing to their simple geometry. Since the source/drain regions 3 adjoin the connection regions 11 in each case on both sides in the longitudinal direction of the word lines 6, more space than in the first embodiment variant is available in the direction for the source/drain contact 17. The alignment of the source/drain contact 17 is therefore non-critical, since a slight lateral displacement of the bit line and of the contact does not impair the electrical contact-connection of the two mutually adjacent source/drain regions 3.

Figure 6:
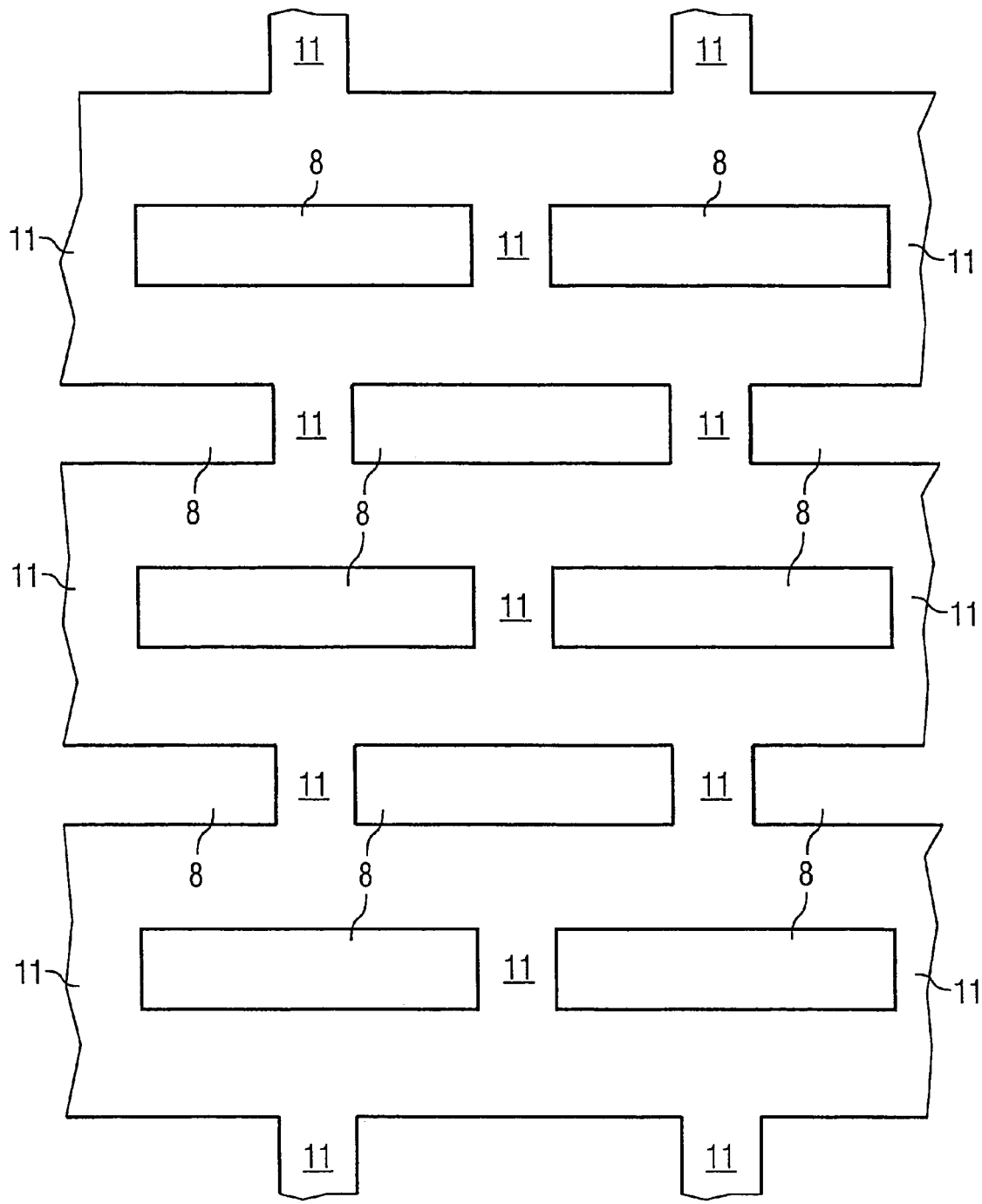
FIG. 6 shows a partial view of the plan view of FIG. 5.

The active area for this exemplary embodiment is illustrated separately in the plan view in FIG. 6. It can be seen particularly clearly in FIG. 6 that the insulation regions 8, in the longitudinal directions of the bit lines, are in each case interrupted by the connection regions 11 which, for their part, bridge the semiconductor strips present between the insulation regions 8 in the direction of the bit lines in each case in the region of the source/drain regions. The insulation regions 8 isolate the successive memory cells along a respective word line on both sides of the word line in each case in alternation.

Figure 7:
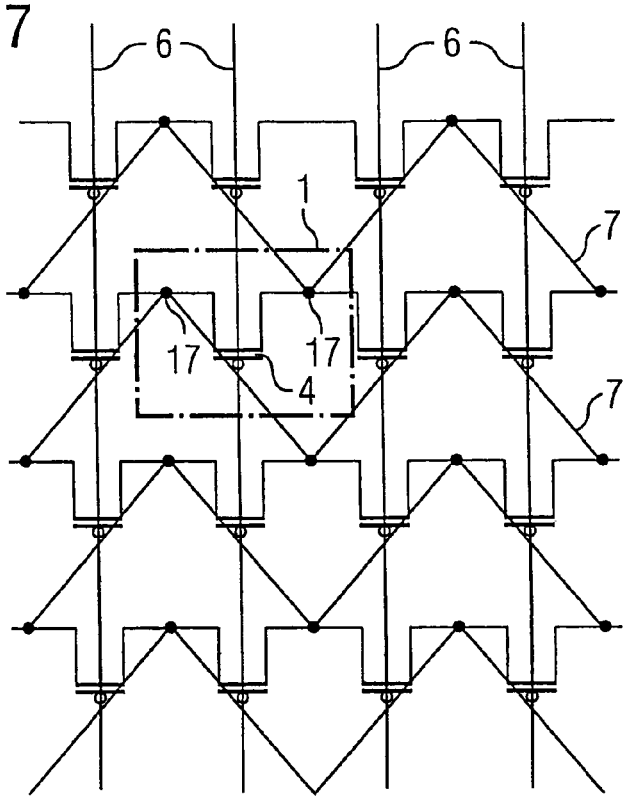
FIG. 7 shows the circuit scheme for the arrangement in accordance with FIG. 1.
Figure 8:
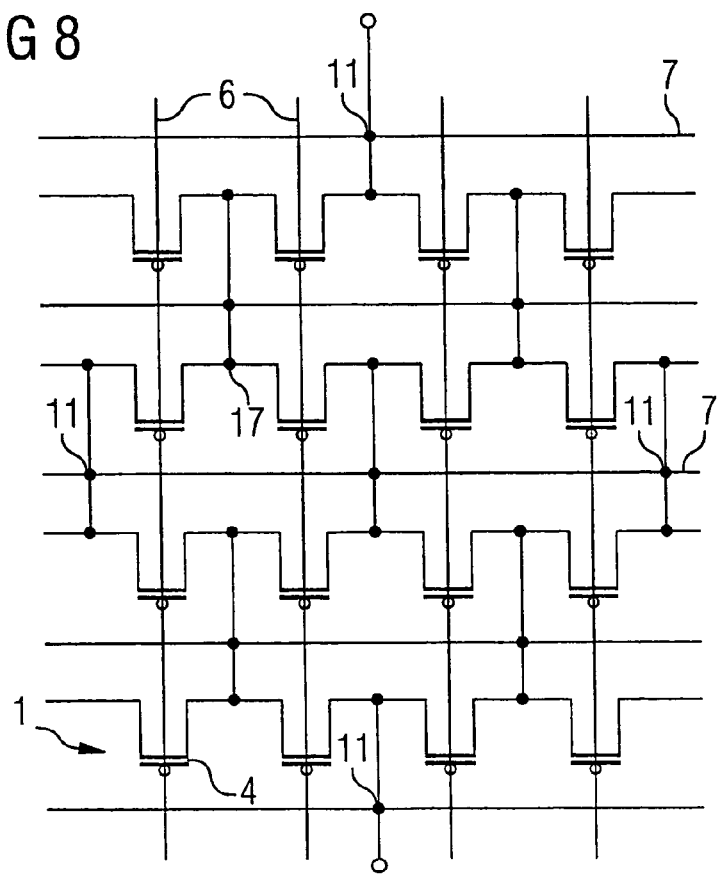
FIG. 8 shows the circuit scheme for the arrangement in accordance with FIG. 5.

FIG. 7 illustrates the circuit scheme of the exemplary embodiment of FIG. 1, in which a memory cell 1 with the associated source/drain contacts 17 is bordered by the broken line. FIG. 8 shows the circuit scheme for the embodiment in accordance with FIG. 5 with connection regions 11, which in each case connect two mutually adjacent source/drain regions to a bit line 7. The reference symbols of the individual parts correspond to the reference symbols of the previously described figures.

For the circuit in accordance with FIG. 8, FIGS. 9 to 11 in each case illustrate what potentials are applied to the word lines and the bit lines in order to program, to read and to erase, respectively, memory cells.

Figure 9:
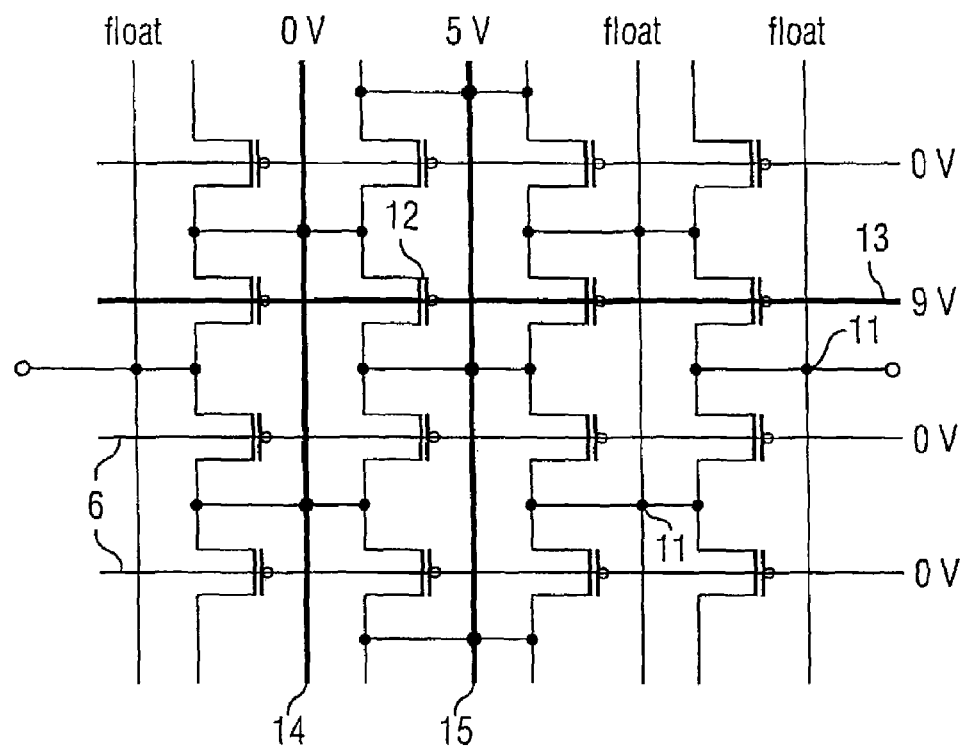
FIG. 9 shows the circuit scheme in accordance with FIG. 8 for the operation of programming a memory cell.

FIG. 9 shows the circuit scheme of FIG. 8 and the applied potentials for the programming of the memory cell 12 to be programmed. 9 volts, for example, are present on the selected word line 13. 0 volts and 5 volts are respectively present on the selected bit lines 14, 15. The remaining word lines are at 0 volts, while the remaining bit lines are open (floating).

Figure 10:
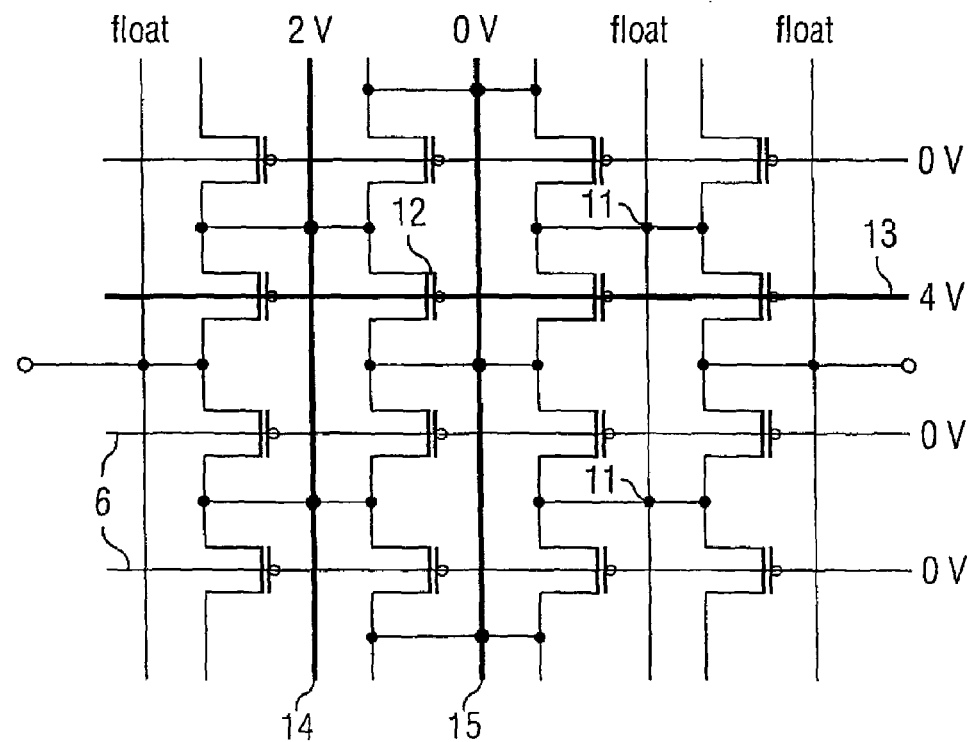
FIG. 10 shows the circuit scheme in accordance with FIG. 8 for the operation of reading a memory cell.

FIG. 10 shows the circuit scheme of FIG. 8 and the applied potentials for the reading of the memory cell 12 to be read. In this case, the selected word line 13 is at 4 volts, while the selected bit lines 14, 15 are at 2 volts and 0 volts, respectively. The remaining word lines are at 0 volts, while the remaining bit lines are open.

Figure 11:
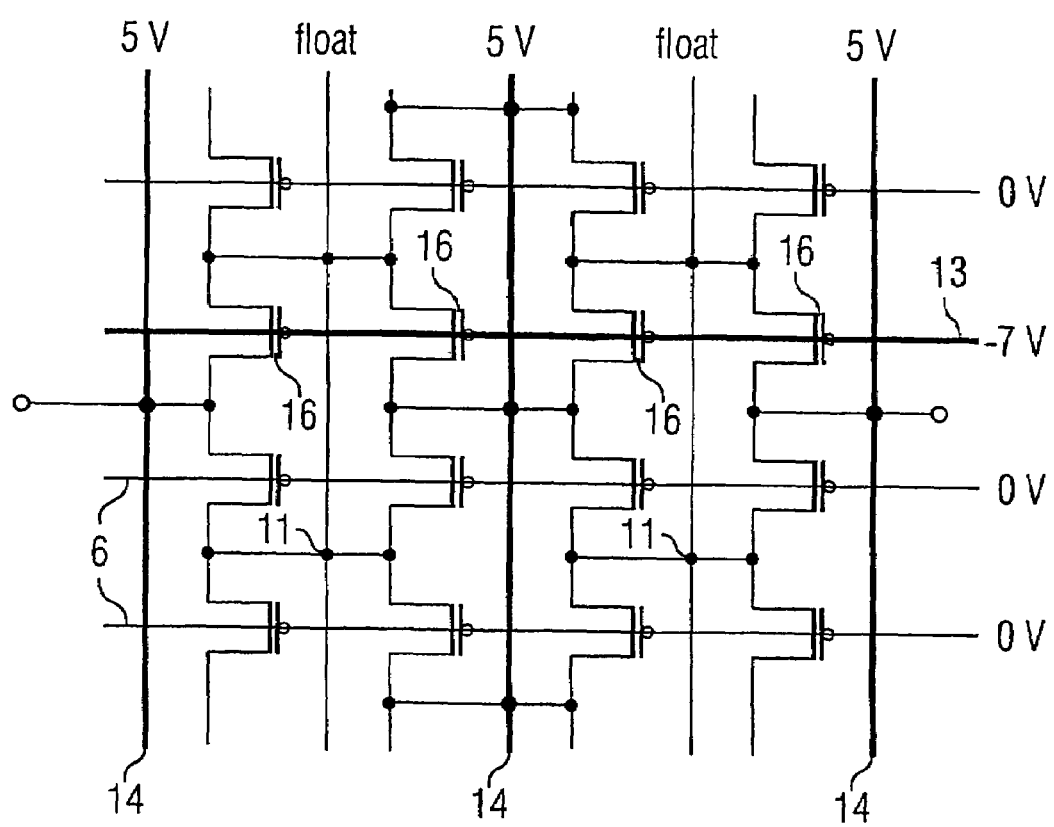
FIG. 11 shows the circuit scheme in accordance with FIG. 8 for the operation of erasing memory cells.

FIG. 11 shows the circuit scheme of FIG. 8 and the applied potentials for the erasure of the memory cells 16 that are to be jointly erased along a selected word line 13. The respective next but one-bit lines successively are selected and put at 5 volts. The selected word line 13 is at minus 7 volts. The remaining word lines are at 0 volts, while the remaining bit lines are open.

During the production of the semiconductor memory, firstly the active area is defined, for example, by surrounding the memory cell array with an insulation. For the formation of the channel regions, doped wells are produced by implantation of dopant. The storage layer sequence, for example, a sequence comprising an oxide, a nitride and an oxide, is deposited over the whole area. Outside the cell array, this storage layer sequence is removed and replaced by a gate oxide for the transistors of the driving periphery. The material for the gate electrodes and word lines is deposited and patterned. The dopant for the source/drain regions is implanted in a self-aligned manner with respect to the word lines. In addition, corresponding source/drain regions are produced for the transistors of the driving periphery. The word lines are covered with an electrical insulation on the top side and the sidewalls. This insulation may be applied as early as before the implantation of the source/drain regions. The bit lines are produced by deposition of a metallization and subsequent patterning of the metal. Contact holes for connecting the bit lines to the source/drain regions are produced beforehand, if appropriate, in a dielectric introduced between the word lines, the contact holes being filled by the deposited metal. In this way, contacts between the word lines on the active area are produced in a self-aligning manner.

Although the present invention and its advantages have been described in detail, it should be understood that various changes, substitutions and alterations can be made herein without departing from the spirit and scope of the invention as defined by the appended claims.

What is claimed is:

1. A semiconductor memory with virtual ground architecture, the memory comprising:
   a plurality of memory cells, each memory cell having a respective memory transistor, the memory cells being arranged row-wise and column-wise;
   each memory transistor comprising a channel region between source/drain regions that are formed in a semiconductor material, each memory transistor further comprising a gate electrode, which is isolated from the channel region by a storage layer sequence that is provided for trapping charge carriers from the channel region;
   a plurality of word lines arranged parallel at a distance from one another, wherein each of the gate electrodes is coupled to one of the word lines, each word line overlying a row of the memory cells such that the word line is over the channel region between the source/drain regions;
   a plurality of bit lines running transversely with respect to the word lines, the bit lines and the word lines being operable to address the memory cells; and
   a plurality of insulation regions extending between no more than two of the word lines;
   wherein, in accordance with a consecutive numbering of the source/drain regions along a respective word line, in the case of which the source/drain regions of a single memory transistor are on different sides of the word line and lie opposite one another with respect to the word line in each case acquire the same number,
   a) on one side of the word line, each even-numbered source/drain region is electrically insulated from the subsequent odd-numbered source/drain region by an insulation region,
   b) on the opposite side of said word line, each odd-numbered source/drain region is electrically insulated from the subsequent even-numbered source/drain region by another insulation region.

2. The semiconductor memory as claimed in claim 1, wherein the gate electrode of each memory transistor is part of a word line.

3. The semiconductor memory as claimed in claim 1, wherein the bit lines are arranged above the word lines and are electrically conductively connected to the source/drain regions in such a way that a memory transistor is addressed by selection of a word line and two bit lines arranged next to one another.

4. The semiconductor memory as claimed in claim 3, wherein the bit lines contact-connect the source/drain regions such that pairs of source/drain regions which are present on different sides of a respective word line and are provided with successive numbers are in each case electrically conductively connected to one another.

5. The semiconductor memory as claimed in claim 4, wherein the insulation regions comprise trenches filled with dielectric material.

6. The semiconductor memory as claimed in claim 1, wherein
the pairs of source/drain regions are electrically coupled to one another by connection regions that comprise doped regions in the semiconductor material, and wherein the bit lines are, in each case, contact-connected on the connection regions arranged in a row transversely with respect to the word lines.

7. The semiconductor memory as claimed in claim 1, wherein the bit lines are arranged rectilinearly parallel at a distance from one another.

8. The semiconductor memory as claimed in claim 1, wherein the bit lines comprise a metal.

9. The semiconductor memory as claimed in claim 1, wherein the storage layer sequence comprises:
a first boundary layer;
a storage layer overlying the first boundary layer; and
a second boundary layer overlying the first boundary layer.

10. The semiconductor memory as claimed in claim 9, wherein the first boundary layer and the second boundary layer each comprise an oxide layer and wherein the storage layer comprises a nitride layer.

11. The device of claim 1 wherein the storage layer sequence comprises:
a first boundary layer comprising an oxide;
a storage layer overlying the first boundary layer, the storage layer comprising a nitride; and
a second boundary layer overlying the first boundary layer, the second boundary layer comprising an oxide.

12. The semiconductor memory of claim 1 wherein a pair of successive and connected source/drain regions in one row that are located between a pair of word lines and that are not isolated by an isolation region from a like pair of successive and connected source/drain regions in an adjacent row are electrically conductively connected to one another, and wherein the bit lines connect alternate pairs of the electrically connected source/drain regions lying along a row.

13. The semiconductor memory of claim 12 wherein at least one bit line connection connects four source/drain regions.

14. A semiconductor memory with virtual ground architecture, the memory comprising:
a plurality of memory cells, each memory cell having a respective memory transistor, the memory cells being arranged row-wise and column-wise;
each memory transistor comprising a channel region between source/drain regions that are formed in a semiconductor material, each memory transistor further comprising a gate electrode, which is isolated from the channel region by a storage layer sequence that is provided for trapping charge carriers from the channel region;
a plurality of word lines arranged parallel at a distance from one another, wherein each of the gate electrodes is coupled to one of the word lines, each word line overlying a row of the memory cells such that the word line is over the channel region between the source/drain regions;
a plurality of bit lines running transversely with respect to the word lines, the bit lines and the word lines being operable to address the memory cells; and
a plurality of insulation regions;
wherein, in accordance with a consecutive numbering of the source/drain regions along a respective word line, in the case of which the source/drain regions of a single memory transistor that are on different sides of the word line and lie opposite one another with respect to the word line in each case acquire the same number,
a) on a first side of the word line, even-numbered source/drain regions are located between two odd-numbered source/drain regions, each even-numbered source/drain region on said first side of the word line being electrically insulated from one of said two odd-numbered source/drain regions by one of said insulation regions, and said each even-numbered source/drain region being electrically connected to the other one of said odd-numbered source/drain regions by one of a plurality of connection regions that comprise doped regions in the semiconductor material,
b) on the opposite or a second side of said word line, the odd numbered source/drain regions that were electrically insulated on the first side are electrically connected on the second side by a further one of said connection regions and the even-numbered source/drain regions that were electrically connected on the first side are electrically insulated on the second side by one of said insulation region; and
wherein the bit lines are, in each case, contact-connected on the connection regions arranged in a row transversely with respect to the word lines.

15. The semiconductor memory of claim 14 wherein at least one bit line connection connects four source/drain regions.

16. The semiconductor memory as claimed in claim 14, wherein the gate electrode of each memory transistor is part of a word line.

17. The semiconductor memory as claimed in claim 14, wherein the bit lines are arranged above the word lines and are electrically conductively connected to the source/drain regions in such a way that a memory transistor is addressed by selection of a word line and two bit lines arranged next to one another.

18. The semiconductor memory as claimed in claim 17, wherein the bit lines contact-connect the source/drain regions such that pairs of source/drain regions which are present on different sides of a respective word line and are provided with successive numbers are in each case electrically conductively connected to one another.

19. The semiconductor memory as claimed in claim 18, wherein the insulation regions comprise trenches filled with dielectric material.

20. The semiconductor memory as claimed in claim 14, wherein the pairs of source/drain regions are electrically coupled to one another by connection regions that comprise doped regions in the semiconductor material, and wherein the bit lines are, in each case, contact-connected on the connection regions arranged in a row transversely with respect to the word lines.

21. The semiconductor memory as claimed in claim 14, wherein the bit lines are arranged rectilinearly parallel at a distance from one another.

22. The semiconductor memory as claimed in claim 14, wherein the bit lines comprise a metal.

23. The semiconductor memory as claimed in claim 14, wherein the storage layer sequence comprises:
 a first boundary layer;
 a storage layer overlying the first boundary layer; and
 a second boundary layer overlying the first boundary layer.

24. The semiconductor memory as claimed in claim 23, wherein the first boundary layer and the second boundary layer each comprise an oxide layer and wherein the storage layer comprises a nitride layer.

25. The device of claim 14 wherein the storage layer sequence comprises:
 a first boundary layer comprising an oxide;
 a storage layer overlying the first boundary layer, the storage layer comprising a nitride; and
 a second boundary layer overlying the first boundary layer, the second boundary layer comprising an oxide.

* * * * *